United States Patent [19]
Ishihara et al.

[11] Patent Number: 4,800,174
[45] Date of Patent: Jan. 24, 1989

[54] METHOD FOR PRODUCING AN AMORPHOUS SILICON SEMICONDUCTOR DEVICE USING A MULTICHAMBER PECVD APPARATUS

[75] Inventors: Shinichiro Ishihara, Takatsuki; Masatoshi Kitagawa, Hirakata; Takashi Hirao, Moriguchi, all of Japan

[73] Assignee: Matsushita Electric Industrial Co., Ltd., Osaka, Japan

[21] Appl. No.: 50,699

[22] Filed: May 18, 1987

[30] Foreign Application Priority Data

May 20, 1986 [JP] Japan .................. 61-115254

[51] Int. Cl.⁴ .......................................... H01L 21/205
[52] U.S. Cl. ............................ 437/101; 148/DIG. 1; 148/DIG. 45; 148/DIG. 72; 148/DIG. 25; 118/723; 427/38; 437/4; 437/18; 437/112; 437/914
[58] Field of Search ............... 148/DIG. 1, 22, 25, 148/45, 72, 169; 118/719, 722, 723, 733, 50.1, 620; 427/38, 39, 41; 437/2, 4, 5, 18, 87, 101, 112, 233, 914, 967

[56] References Cited

U.S. PATENT DOCUMENTS

| 4,438,723 | 3/1984 | Cannella et al. | 118/723 |
| 4,485,125 | 11/1984 | Izu et al. | 427/39 |
| 4,519,339 | 5/1985 | Izu et al. | 427/39 |
| 4,525,376 | 6/1985 | Edgerton | 118/712 |
| 4,576,829 | 3/1986 | Kaganowicz | 427/39 |
| 4,634,601 | 1/1987 | Hamakawa et al. | 427/39 |
| 4,636,401 | 1/1987 | Yamazaki et al. | 437/2 |
| 4,646,681 | 3/1987 | Fujiyama | 118/50.1 |
| 4,664,939 | 5/1987 | Oushinsky | 437/4 |
| 4,690,717 | 9/1987 | Yamazaki | 437/2 |

Primary Examiner—Brian E. Hearn
Assistant Examiner—William Bunch
Attorney, Agent, or Firm—Stevens, Davis, Miller & Mosher

[57] ABSTRACT

A method of producing an amorphous silicon semiconductor device makes use of a capacitance-coupled high-frequency glow-discharge semiconductor production apparatus which is equipped with a plurality of glow-discharge chambers each having a high-frequency electrode and a substrate holder opposing each other and means for supplying material gases to the glow-discharge chambers. A reaction of a material gas is effected in a first glow-discharge chamber, so as to form a semiconductor layer having a first conductivity type on a substrate introduced into the first glow-discharge chamber, and, after moving the substrate into a second glow-discharge chamber, a reaction of a material gas different from the material gas used in the first glow-discharge chamber is effected, thereby forming a semiconductor layer having a second conductivity type on the semiconductor layer of the first conductivity type. The substrate with the semiconductor layer of the first conductivity formed thereon is moved from the first glow-discharge chamber to the second glow-discharge chamber after a predetermined gas atmosphere is formed in the first glow-discharge chamber. The distance between the electrode and the substrate holder is made smaller in one of the first and second glow-discharge chambers which is designed for forming the thicker one of the semiconductor layers of the first and second conductivity types than in the other of the first and second glow-discharge chambers. The temperature of the substrate is set higher in one of the first and second glow-discharge chambers which is designed for forming the thicker one of the semiconductor layers of the first and second conductivity types than in the other of the first and second glow-discharge chambers.

5 Claims, 9 Drawing Sheets

METHOD FOR PRODUCING AN AMORPHOUS SILICON SEMICONDUCTOR DEVICE USING A MULTICHAMBER PECVD APPARATUS

BACKGROUND OF THE INVENTION

The present invention relates to a method of and apparatus for producing an amorphous silicon semiconductor device. More particularly, the present invention is concerned with an improvement in the method of and apparatus for producing an amorphous silicon semiconductor device in which a plurality of amorphous silicon layers having different conductivity types or a plurality of amorphous layers consisting mainly of silicon and having different optical band gaps are successively formed on a substrate, by allowing plasma reaction of a material gas such as silane gas, an impurity gas which determines the conductivity type, e.g., diborane, phosphine or the like, or a silane gas which contains impurity gas, e.g., methane, ethane ethylene, acetylene, german, ammonia, nitrogen, oxygen or a compound of nitrogen and oxygen.

Figure 7:
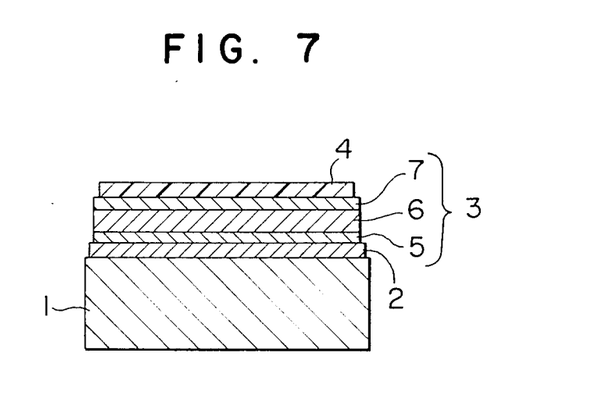
FIG. 7 is a vertical sectional view of an a-Si photoelectromotive force device.

FIG. 7 shows the construction of a photovolatic force device which is a typical example of semiconductor devices making use of amorphous silicon (referred to as a-Si hereinunder). A reference numeral 1 designates a transparent insulating substrate such as a glass sheet on which are successively formed a plurality of layers including a transparent conductive layer 2 such as of indium tin oxide, an a-Si film 3 and a rear surface electrode layer 4 such as of aluminum. The a-Si layer is composed of a p-type layer 5 in contact with the transparent electrode 2, an n-type layer 7 contacting the rear surface electrode 4 and an i-type layer (non-dope layer) 6 intermediate between the layers 5 and 7. These layers 5, 6 and 7 are formed by deposition through plasma reactions of silane gases containing suitable impurities. The term "i-type layer" means a layer which is not doped with any impurity. However, the i-type layer 6 of a-Si may contain a trace amount of impurity because this layer 6 inherently has slight n-type conductivity. The i-type layer 6 also may contain elements of Group IV in periodic table, e.g., germanium (Ge), tin (Sn) or the like, in order that this layer has a reduced optical inhibition band width.

Figure 8:
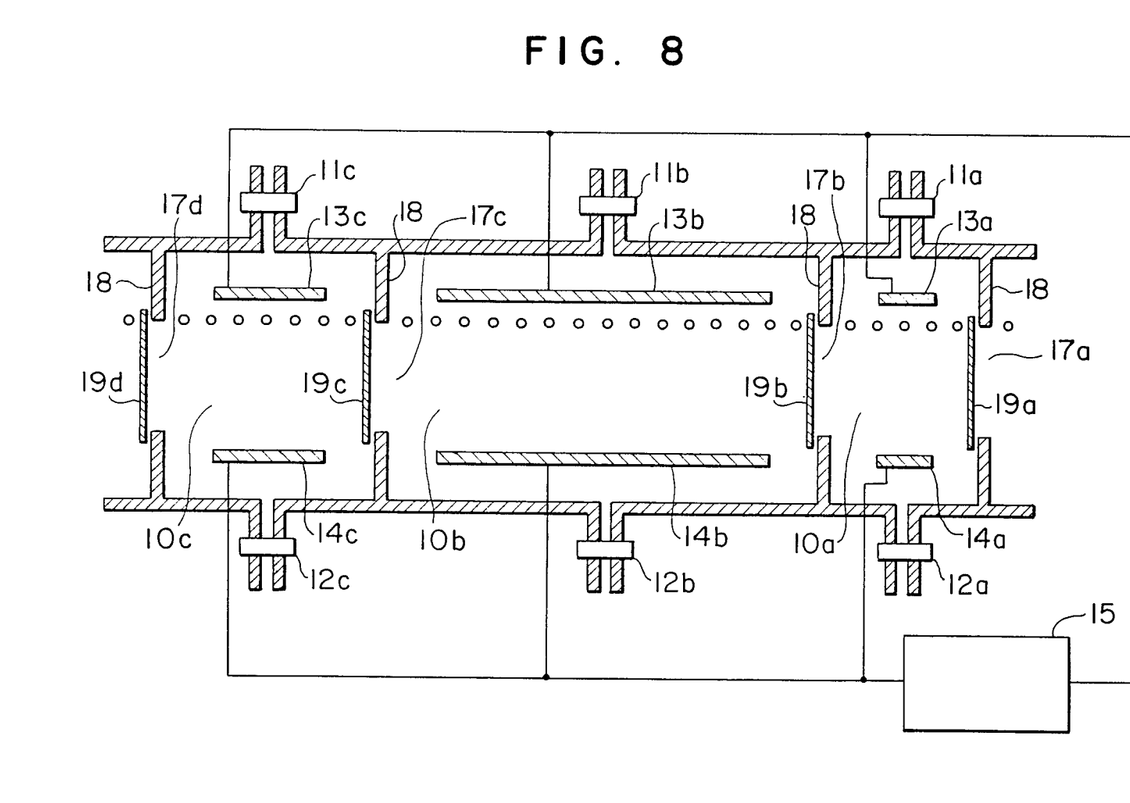
FIG. 8 is a schematic sectional view of a conventionally used production apparatus.

FIG. 8 shows a conventional plasma reaction apparatus which is suitably used for the purpose of forming the a-Si film 3. The apparatus has first to third reaction chambers 10a to 10c which are arranged apart from and in a side-by-side fashion to each other. These reaction chambers 10a to 10c are adapted to be supplied with predetermined reaction gases through first to third valves, respectively. More specifically, a silane gas (SiH$_4$) and diborane gas (B$_2$H$_6$) are introduced through the first valve 11a, while the second valve 11b is adapted for passing the silane gas. The third valve 11c is adapted to pass the silane gas and a phosphin gas (PH$_3$). The reaction chambers 10a to 10c are adapted to be evacuated by a vacuum system through fourth to sixth valves. First electrodes 13a to 13c and second electrodes 14a to 14c are disposed in the respective reaction chambers such that the first and the second electrodes in each chamber oppose each other. An A.C. electric field is applied between the first and the second electrodes by means of an A.C. power supply 15. A reference numeral 16 designates a roller conveyor which is interposed between the first and the second electrodes 13 and 14 in each reaction chamber. The conveyors 16 are adapted to be used for conveying the substrate from the first to third reaction chambers. The first to third reaction chambers 10a to 10c have vertical walls 18 which are provided with first to fourth passage windows 17a to 17d formed at the same level and first to fourth shutters 19a to 19d adapted for opening and closing these window passages. The arrangement is such that, when a substrate is from one to another reaction chamber, the shutters are operated to open the desired passage windows.

A conventional method for producing an amorphous silicon semiconductor device employing the apparatus shown in FIG. 8 will be explained hereinunder.

A substrate 1 on which is formed a transparent conductive film 2 alone is moved from the first window passage 17a into the first reaction chamber 10a by means of a roller conveyor 16. In this state, all the shutters 19a to 19d are in closed position, and all the roller conveyors 16 are stopped. In addition, first to sixth valves 11a to 11c and 12a to 12c are closed, and no electric field is applied to the first and second electrodes 13 and 14. Subsequently, the first to third reaction chambers 10a to 10c are evacuated through the fourth to sixth valves 12a to 12c. Thereafter, the first valve 11a is opened so that the silane gas and diborane gas are introduced into the first reaction chamber 10a. Then, an electric field is applied between the first and the second electrodes in the first reaction chamber 10a so as to cause plasma reaction in this reaction chamber 10a. As a result, p-type layer 5 is formed on the transparent conductive film 2.

After the formation of the p-type layer 5, the discharge in the first reaction chamber 10a is stopped and then the gas is purged from the first reaction chamber 10a. Thereafter, the second shutter 19b is opened and the substrate 1 is moved from the first reaction chamber 10a to the second reaction chamber 10b through the second passage window 17b. Then, after the second shutter 19b is closed, the second reaction chamber 10b is filled with silane gas and electric field is applied between the first and the second electrodes 13b and 14b in the second reaction chamber 10b, thereby forming the i-type layer 6. Then, after the gas in the second reaction chamber 10b is purged, the substrate is moved to the third reaction chamber 10c. After the third reaction chamber 10c is charged with the material gas which is the mixture of silane gas and phosphin gas, electric field is applied between the electrodes 13c and 14c thereby forming the n-type layer 7.

As will be understood from the foregoing description, the conventional method and apparatus for producing an amorphous silicon semiconductor device having a plurality of a-Si layers of different conductivity types require the substrate to be moved, after an a-Si layer of a specific conductivity type is formed, from one reaction chamber to another reaction chamber. Before moving the substrate, it is necessary that the material gas is purged from the reaction chamber from which the substrate is to be moved. In addition, it is necessary that the discharge be stopped each time the substrate is moved. In consequence, time is wastefully consumed for the purge of the gas from each reaction chamber, resulting in an impractically large consumption of the material gases. Furthermore, greatest care is required for the handling of the wasted material gases because these gases are generally dangerous. It is to be noted also that, since no specific consideration is given to the spacings between the electrodes in the respective reaction chambers, the film-forming speeds in these chambers are the same. In the case of the production of PIN-type photoelectromotive force device, the i-type layer has a thickness which is about 10 times as large as those of the other layers. This means that the formation of the i-type layer requires a processing time which is about 10 times as long as those required for the formation of the other layers. In consequence, the rate of production of this type of device is limited by the rate of formation of the i-type layer.

SUMMARY OF THE INVENTION

Accordingly, an object of the present invention is to overcome the above-described problems of the prior art.

To this end, the present invention proposes improved method and apparatus which is based upon the following discoveries.

(1) The spacing between the electrodes is intentionally reduced in a specific reaction chamber. The reduced spacing between the electrodes increases the rate of deposition of the material on the substrate.

(2) An increased rate of deposition tends to cause a fluctuation in the thickness of the layer. However, there is an optimum value of the vacuum which ensures a uniform rate of deposition.

(3) An increase in the deposition rate also causes a problem that the reliability of the semiconductor device as the product is impaired when the substrate temperature which has been considered as being optimum in the conventional process is adopted. This problem, however, can be overcome by adopting a substrate temperature which is higher than that employed conventionally.

The method and apparatus which make use of these facts enable the forming speeds in different reaction chambers to be equalized regardless of the variation in the thicknesses of the layers to be formed. This theoretically enables the deposition of the successive layers to be formed continuously. In addition, it becomes unnecessary to purge whole of the material gas from each reaction chamber when the substrate is moved from this reaction chamber to the next reaction chamber. This advantageously reduces the consumption of the material gas and shortens the time required for the production of the semiconductor device.

In general, in a production system having a plurality of successive processing chambers, a higher efficiency is obtained when the chambers have an equal size. The method of the present invention is advantageous in that it enables the deposition rates in different chambers to be controlled independently in accordance with the thicknesses of the layers to be obtained, thus allowing the sizes of the reaction chambers to be equalized. This in turn offers various advantages such as reduction in the size of the whole equipment, as well as easy replacement of parts of the reaction chabers and common use of the parts of the reaction chambers. In consequence, the production cost is reduced and the maintenance of the apparatus is facilitated.

In particular, the spacing between the electrodes in the chamber for forming the i-type layer is selected to be short, in order to increase the rate of deposition. The reduced spacing between the electrodes suppresses inclusion of undesirable impurities. In general, the characteristics of the i-type layer is largely impaired by inclusion of impurities. The suppression of inclusion of impurities in the i-type layer, therefore, offers a great advantage from the view point of the quality of the semiconductor device as the product.

The above and other objects, features and advantages of the present invention will become clear from the following description of the preferred embodiment when the same is read in conjunction with the accompanying drawings.

DESCRIPTION OF THE PREFERRED EMBODIMENTS

The present invention is based upon the following findings or considerations.

(1) The rate of deposition of a-Si material can be increased by a reduction in the spacing between the electrodes.

Figure 2:
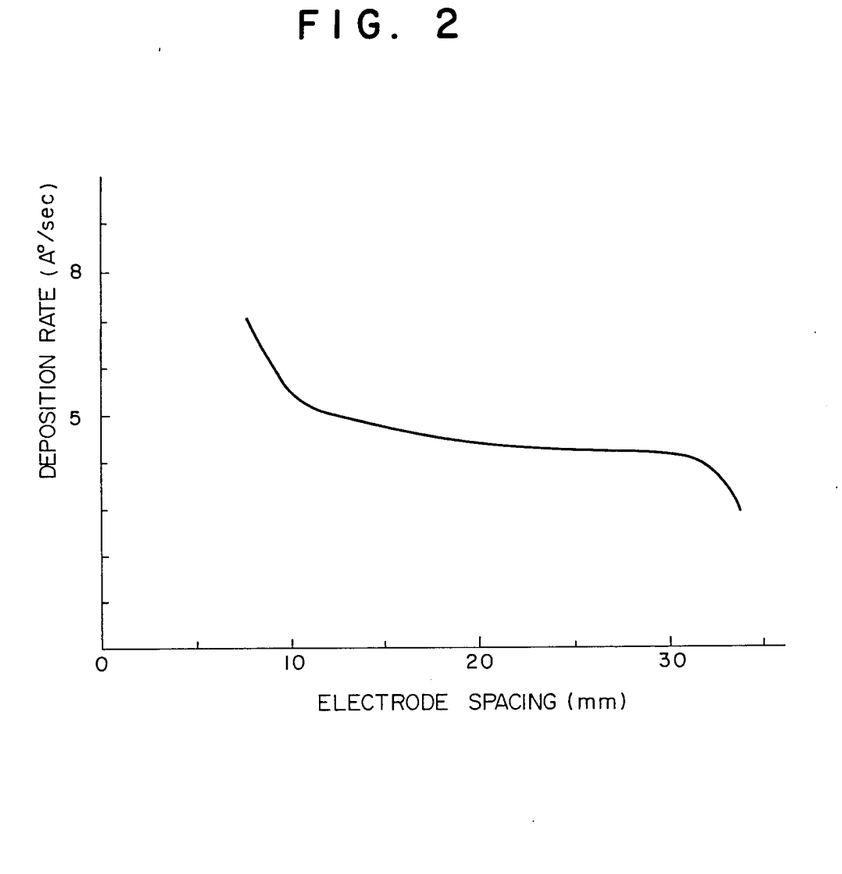
FIG. 2 is a graph illustrating the spacing between the rate of deposition of an a-Si layer and the spacing between the electrodes in the reaction chamber in which the a-Si layer is formed.

FIG. 2 is a chart which exemplarily shows the deposition rate (axis of ordinate) in relation to the electrode spacing (axis of abscissa) as observed when the deposition is effected using a high-frequency power of 50 W within a reaction chamber in which a vacuum of 1 Torr. is maintained. It will be seen from this figure that the discharge does not take place when the spacing between the electrodes is greater than 33 mm. When the spacing ranges between 15 and 30 mm, the deposition rate is substantially equal and falls on the order of 4 to 5 Å/sec, although the smaller spacing provides the greater deposition rate. The maximum deposition rate, which is about 7 Å/sec, is obtained when the spacing between the electrodes is 8 mm. The discharge is terminated when the spacing is reduced below 8 mm. Thus, a tendency is generally observed that the smaller spacing between the electrodes provides the greater deposition rate. This is attributable to the fact that, since the high-frequency electrode surface on which most of growth precussors is formed is positioned closer to the substrate, the precussors can efficiently reach the substrate surface.

(2) Deposition rate and thickness uniformity in relation to vacuum in the reaction chamber.

Figure 3:
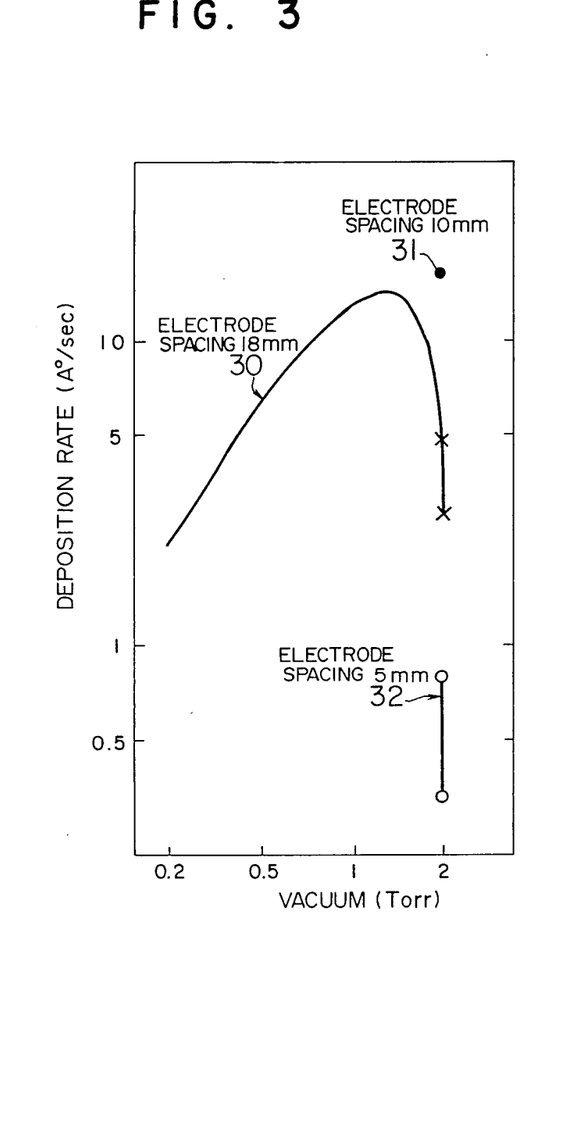
FIG. 3 is a graph illustrating change in the rate of deposition of an a-Si layer, as well as in the uniformity of the thickness of the a-Si layer, as observed when the level of the vacuum in the reaction chamber is changed.

FIG. 3 is a graph showing the deposition rate 30 in relation to the vacuum level (axis of abscissa) as observed when the deposition is conducted with high-frequency power of 70 W with the electrode spacing of 18 mm. Numerals 31 and 32 indicate the deposition rate obtained when the electrode spacing is 10 mm and 5 mm, respectively, under the vacuum of 2 Torr. The increased vacuum level increases the density of the growth nuclides of a-Si and, hence, increases the deposition rate. This effect, however, is saturated when the vacuum has reached 2 Torr. It will also be understood that the deposition rate also is changed by the electrode spacing even when the vacuum is maintained constant at 2 Torr., as will be seen from the comparison between the deposition rate 31 obtained with the electrode spacing of 10 mm and the deposition rate 32 obtained with the electrode spacing of 5 mm. This is attributable to the following fact. Namely, an increased level of vacuum increases the number of particles of the material gas in the space between the electrodes so that the number of collision between the electrons and the material particles is increased. As a result, the temperature of the electrons is lowered so that energy of the electrons is lowered to a level necessary for maintaining the discharge, insofar as the discharge power is maintained constant. A too small spacing between the electrodes also prevents the discharge. This is attributed to mismatching between the output impedance of the discharge power supply and the input impedance of the discharge apparatus. In most cases, this type of apparatus employs a matching device which is generally known as "matching box" which smooths the supply of the power from the power supply to the apparatus. On the other hand, the input impedance of the apparatus includes the capacitance formed between the electrode and the substrate holder. The capacitance is changed by the spacing between the electrode and the substrate holder, as well as by the density of the plasma formed therebetween. As the spacing between the electrodes is decreased, the density of the plasma is increased correspondingly and the capacitance of the parallel plate capacitor formed by the electrode and the substrate holder also is increased. In consequence, the impedance matching is suddenly lost as the state of operation is shifted from a mode in which good impedance matching is obtained to a mode in which the deposition is effected rapidly, so that the discharge is stopped. Conversely, a too large spacing between the electrodes increases the number of particles in the space between the electrodes, so that the density of the plasma is decreased correspondingly with the result that the discharge is stopped.

Figure 4A:
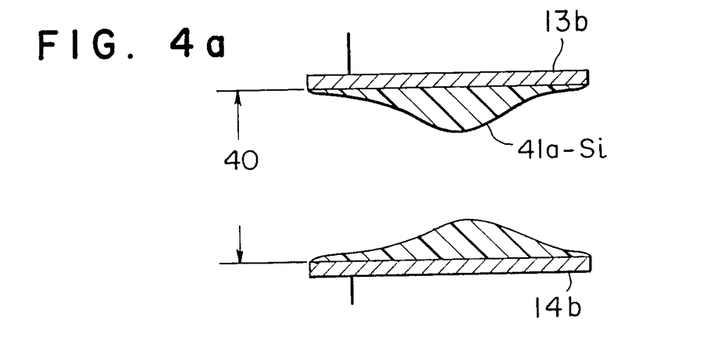
FIGS. 4a to 4c are schematic illustrations of the non-uniformity in the rate of deposition on a substrate layer as observed when the spacing between the electrode is changed.
Figure 4B:
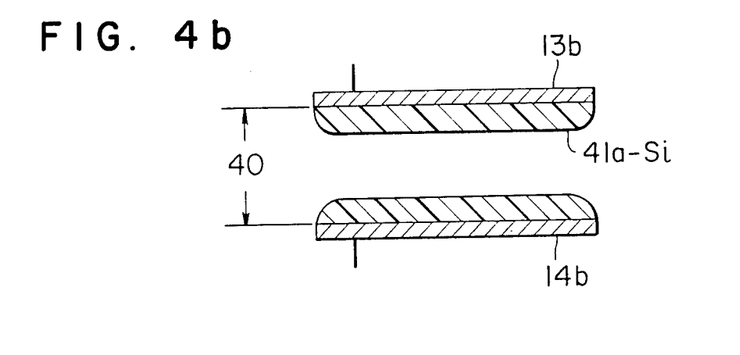
Figure 4C:
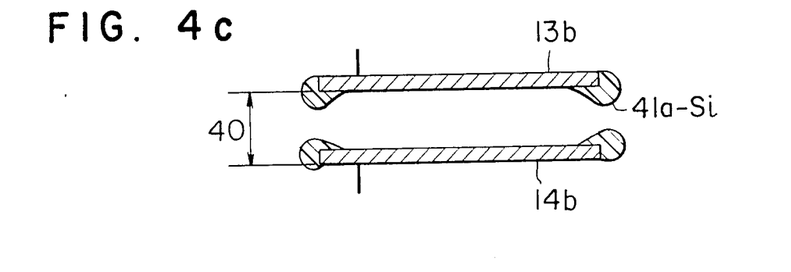

Referring again to FIG. 3, the deposition rate fluctuates largely depending on the electrode spacing when the vacuum is on the order of 2 Torr. The manner of fluctuation will be explained hereinunder with reference to FIGS. 4a to 4c which are sectional views of the substrate holder and the electrode showing the distribution of thickness of the a-Si layer formed thereon. FIG. 4a shows the thickness distribution as obtained when the electrode spacing 40 is large. In this case, the a-Si layer is deposited such that the thickness thereof is large on the central region of the electrodes 13b, 14b but is small at both end portions of the electrodes. Conversely, when the electrode spacing 40 is small, the a-Si is deposited only on the end portions of the electrodes 13b, 14b and no deposition is formed on the central regions of the electrodes, as shown in FIG. 4c. FIG. 4b shows the case where the spacing 40 between the electrodes 13b, 14b is optimized so that a-Si layer is formed on these electrodes with uniform thickness distribution. Thus, under the vacuum of 2 Torr. in FIG. 3, a thickness distribution of the a-Si layer represented by FIG. 4a is obtained when the electrode spacing is 18 mm, whereas a thickness distribution represented by FIG. 4c is obtained when the electrode spacing is 5 mm. It will be seen that a uniform thickness distribution as represented by FIG. 4b is obtainable when the electrode spacing is 10 mm. From these facts, it is understood that a high deposition rate with uniform thickness distribution is obtainable by varying and selecting suitable values of the electrode spacing and the vacuum level in accordance with the procedure explained above. It will also be understood from FIG. 3 that the deposition rate can be increased more than 10 times as compared with the conventional case.

(3) Substrate temperature and reliability of the semiconductor device

A higher disposition rate means a higher rate of decomposition of the material gas and, hence, an increase in the number of the growth nuclides. In case of $SiH_4$ for example, two $H_2$ molecules are formed when Is is deposited as a solid. $H_2$ has a specific heat value which is greater than that of $SiH_4$. In addition, the quantity of $H_2$ molecules is twice as large that of $SiH_4$. $SiH_4$ is introduced without being heated substantially, so that its temperature is almost the same as the room temperature or may be somewhat lower than the room temperature because it experiences an adiabatic expansion when introduced into the apparatus. As the $SiH_4$ is decomposed, a large quantity of $H_2$ is formed so that the substrate surface is contacted by a large number of $H_2$ molecules which have a large specific heat value and maintained substantially at the room temperature. In consequence, the substrate surface is cooled to a level below the temperature optimum for the deposition. In order to obviate this problem, the present invention proposes to set the substrate temperature at the level which has been considered as being optimum.

Figure 5:
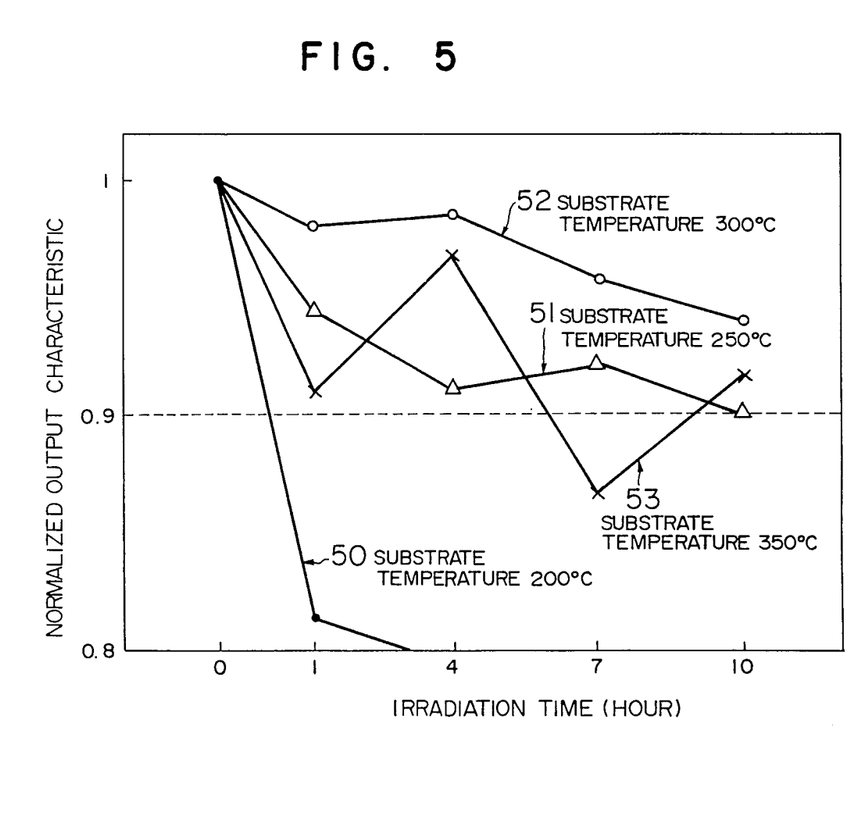
FIG. 5 is a graph which shows the relationship between AM1 irradiation time and the normalized output characteristics of a photoelectromotive force device, using the substrate temperature as a parameter.

In case of an a-Si photoelectromotive force device, the reliability of the device is closely related to a phenomenon which is known as Staebler-Wronski effect. This is a phenomenon that the output characteristic of the device is impaired when the device is irradiated with a strong light. FIG. 5 shows the output characteristic of a photovolatic force device in terms of normalized output as obtained when the device is irradiated with AM1 (Air Mass One) of 100 mW/cm$^2$ using the substrate temperature as a parameter. The output characteristic was measured under the illumination of 200 lx by a fluorescent lamp. This low level of illumination was used because the deterioration of the output characteristic is serious particularly in the region where the illumination is low. For a comparison purpose, a conventional process was carried out with the substrate temperature set at 200° C. It will be seen that the device formed at high rate of deposition with the substrate temperature set at 200° C. exhibits a drastic deterioration in the output characteristic within quite a short period which is less than 1-hour when irradiated with the 100 mW/cm² AM1, as indicated by 50 in FIG. 5. On the other hand, the device formed in accordance with the conventional method holds the output level which is not lower than 90% of the initial value even after 10-hour irradiation by the 100 mW/cm² AM1, as show in FIG. 6.

The deterioration in the output characteristic in such a short period is attributable to the following fact. Namely, since the substrate surface is cooled substantially, unstable Si-H bonding is formed in the a-Si layer, so that the a-Si layer is materially cut as a result of irradiation with light, resulting in a deterioration of the characteristic. When the substrate temperature is set at 250° C. as at 51 and 52, however, the device formed at the increased deposition rate exhibits output level of not lower than 90% of the initial output level, even after 10-hour irradiation with AM1 of 100 mW/cm². It seems that another factor which renders the characteristic unstable is involved when the substrate temperature is raised to 350° C. as indicated by 53.

From the test data as shown in FIG. 5, it is understood that a high reliability of the semiconductor device as the product is ensured by raising the substrate temperature to a level which is about 50° to 100° C. higher than the conventional temperature, provided that the condition for the deposition is the same as that of the experiment. Actually, however, the effect of cooling on the substrate surface varies depending on various factors such as the pattern in which the material gas flows, the manner of setting of the substrate, and so forth. This means that the optimum amount of the temperature rise above the level which has been considered as being optimum cannot be definitely determined.

Figure 9:
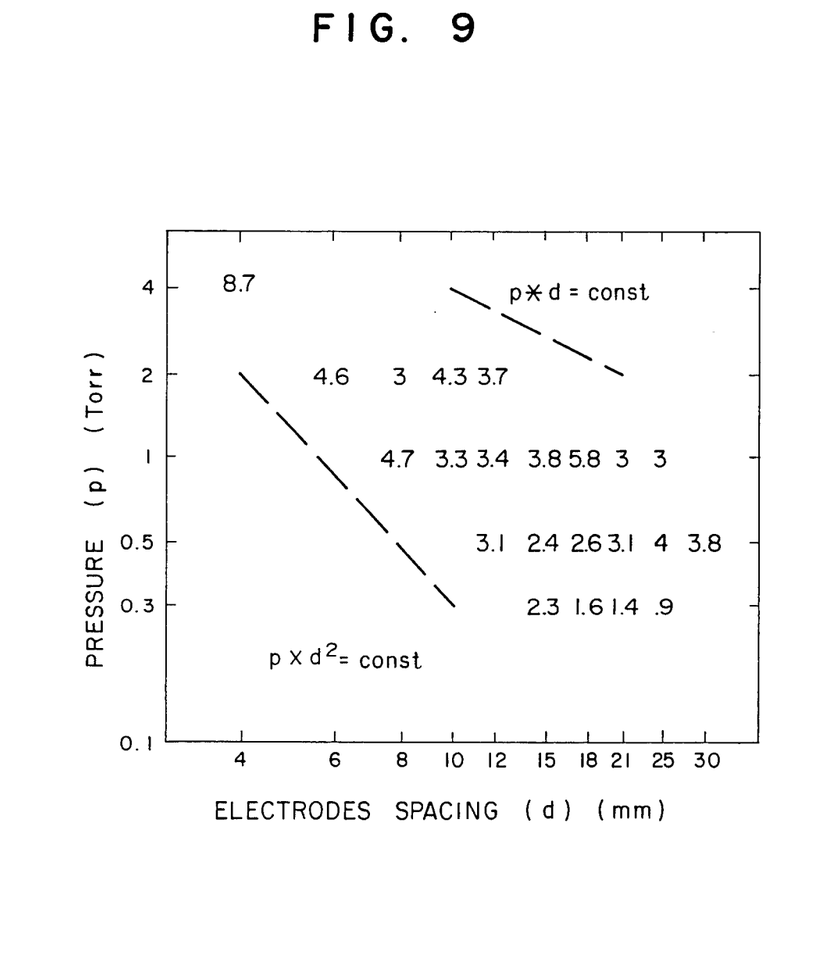
FIG. 9 is a chart map illustrating a change in the deposition rate in accordance with a change in the vacuum P during discharge and the spacing d between electrodes.

In the foregoing discussion three factors which affect the deposition rate, i.e., the electrodes spacing d, vacuum p and the substrate temperature, are varied independently. However, as will be understood also from FIG. 3, the influences of the electrodes spacing d and the vacuum p on the deposition rate are closely related to each other. FIG. 9 is a graph showing how the electrodes spacing d (abscissa) and the vacuum level p are related to each other, using the deposition rate as a parameter. It will be understood that the deposition rate is generally increased both by an increase in the pressure and a decrease in the electrode spacing. The data shown in FIG. 9 has been obtained through an experiment which was conducted with discharge power of 20 W at the substrate temperature of 200° C. under the supply of SiH₄ at a rate of 60 SCCM (Standard Cubic Centimeter per Minute) without any dilution. In FIG. 9, areas where no numeral is written is the region where discharge could not be conducted stably. The region where the discharge could be effected stably has a generally triangular form. Each side of the triangle forms a boundary. The right side is expressed by $p \times d$=constant, whereas the left side is represented by $p \times d^2$=constant.

According to Paschen's law, using the variables as represented by the abscissa and ordinate as shown in FIG. 9, the boundaries are expressed by two parallel lines expressed by $p \times d$=constant. This, however, cannot be applied to the left side. Namely, SiH₄ is decomposed as a result of the discharge and the rate of the decomposition varies depending on the processing conditions. Therefore, different Paschen's curves are formed in accordance with the ratios of mixing of various intermediate products and are superposed so that the left side cannot be expressed by $p \times d$=constant. The condition of $p \times d^2$=constant is met when SiH₄ is pure. However, in case of SiH₄ containing H₂ mixed therein, the condition is expressed by $p \times d^n$=constant (n>2) with the value of n varying in accordance with the presence of diluting gas.

A discussion will be made as to the significance or meaning of the condition $p \times d$=constant. Where the areas of the electrodes and the flow rate of the gas are constant, the condition $p \times d$=constant means that the quantity of the molecules residing in the space formed between two electrodes is constant. This in turn means that the discharge power per one molecule of SiH₄ is constant, because the total discharge power is constant. Thus, the condition of $p \times d$=constant, defining the right side boundary, represents the minimum value of the discharge power per SiH₄ molecule necessary for maintaining the discharge with pure SiH₄ gas.

Figure 10:
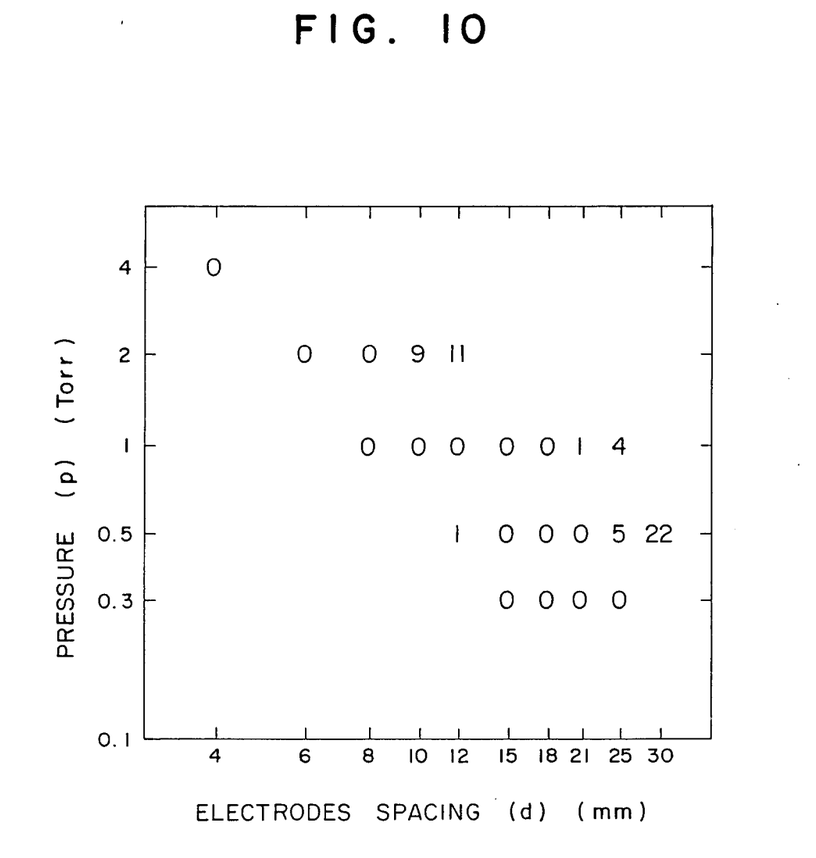
FIG. 10 is a chart showing the rate of reduction (%) in the photoelectric current in the a-Si film formed in accordance with the chart map shown in FIG. 9.

The Staebler-Wronski effect on the a-Si layer formed by the process explained in connection with FIG. 9 was measured. The result of the measurement is shown in FIG. 10. In order to evaluate the deterioration (F) of the output characteristic caused by irradiation with light, the extent of deterioration (F) was defined in terms of the reduction in the photoelectric current as follows.

$$F = (I_{ini} - I_{30})/I_{ini} \times 100 \, (\%)$$

where, $I_{ini}$ represents the initial photoelectric current, while $I_{30}$ represents the photoelectric current observed after 30-minute irradiation with AM1 of the power level of 100 mW/cm². As will be seen from FIG. 10, a large F value was observed with the a-Si layer which has been formed under the condition on or near the boundary line $p \times d$=constant. In other words, the Staebler-Wronski effect does not take place when the electrodes spacing d is reduced as suggested by the present invention. The a-Si layer which exhibits a large F value has a greater optical band gap Eg greater than those obtained under other conditions, and the activation energy Ea greater than ½ of the optical band gap Eg. It has been found also that the amount of H bonded to Is is greater than that in the conventional case, as a result of inspection through infrared absorption.

The following embodiments were carried out on the basis of the findings or discoveries explained hereinbefore.

EMBODIMENT 1

Method of Producing Photoelectromotive Force Device

Figure 1:
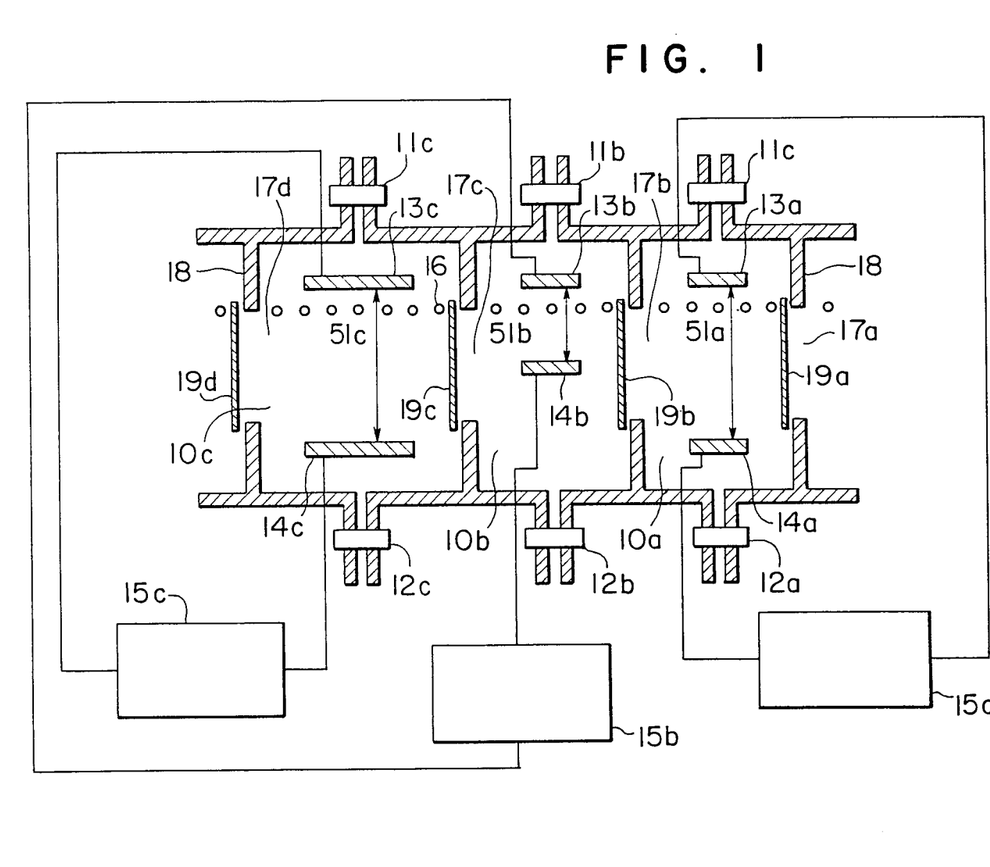
FIG. 1 is a schematic sectional view of an apparatus which is suitable for use in carrying out an embodiment of the production method in accordance with the present invention.

A description will be made hereinunder as to an embodiment of the production method in accordance with the present invention, carried out with an apparatus shown in FIG. 1 for the production of a photoelectromotive force device as a typical example of an amorphous silicon semiconductor device of the invention, having a p-type layer 5, i-type layer 6 and an n-type layer 7 which are formed successively. The apparatus shown in FIG. 1 is different from the apparatus shown in FIG. 8 in that the electrodes spacing 51b in the reaction chamber 10b for forming the i-type layer 6 is smaller than those in other reaction chambers 10a, 10c, that different A.C. power supplies 15a, 15b and 15c are employed for different reaction chambers 10a, 10b and 10c and in that all the reaction chambers 10a, 10b and 10c have an equal size. It is to be understood, however, a single A.C. power supply may be used commonly as the A.C. power supplies 15a and 15c, provided that the timing chart of the deposition process is suitably designed.

In this embodiment, an electric field is applied constantly at least between the electrodes 13b and 14b of the reaction chamber 10b so that discharge for high-rate deposition is maintained in this reaction chamber 10b. The roller conveyor 16 is kept inoperative unless the operation becomes necessary for moving the substrate 1. Before the substrate 1 is introduced into this reaction chamber 10b, at least the first shutter 19a is closed and a dummy substrate is placed at least in the reaction chamber 10b.

The temperature of the substrate is adjusted to the a-Si deposition temperature in an auxiliary chamber (not shown) disposed adjacent to the first reaction chamber 10a. Then, the same material gas as that used in the first reaction chamber 10a is introduced into the auxiliary chamber. Subsequently, the first shutter 19a is opened and the substrate 1 is introduced into the first reaction chamber 10a. Then, the shutter 19a is closed and the gas in the auxiliary chamber is purged, thus preparing for the pre-heating of the next substrate. When the p-type layer 5 is to be formed in the first reaction chamber 10a, a mixture gas of $SiH_4$ and $B_2H_6$ is used as the material gas. When the p-type layer to be formed is an a-Si layer, a hydrocarbon gas such as $CH_4$, $C_2H_4$ or $C_2H_2$ is used together with $SiH_4$ and $B_2H_6$. After the p-type layer 5 has been formed through deposition, discharge is stopped and the $SiH_4$ gas solely is introduced, while adjusting the substrate temperature to the level suitable for the treatment in the second reaction chamber 10b. Namely, the same gas atmosphere as that in the second reaction chamber 10b is formed in the first reaction chamber 10a and the temperature of the substrate is raised to the same level as that to be obtained in the second reaction chamber 10b. Then, the pressure in the first reaction chamber 10a is adjusted to the same level as that in the second reaction chamber, and the second shutter 19b is opened to allow the substrate 1 to be introduced into the second reaction chamber 10b. The monitoring of the gas pressure essentially requires a diaphragm-type vacuum gauge. The use of a Pirani vacuum gauge, for instance, is not recommended because this type of vacuum gauge largely changes its scale depending on the specific heat of the gas. Namely, the Pirani vacuum gauge cannot give exact gas pressure data because the gas compositions are different in the first and the second reaction chambers and the gas in the second reaction chamber 10b has a large content of $H_2$ gas which inherently has a large specific heat. After the introduction of the substrate, the second shutter 19b is closed and the material gas for the p-type layer is again charged in the first reaction chamber 10a, thus preparing for the introduction of the next substrate.

As explained before, the electrodes spacing is smaller in the second reaction chamber 10b than in other reaction chambers, and the substrate temperature in the second reaction chamber 10b is set at a level higher than those in other reaction chambers, so that the deposition is effected at a high rate so as to form the i-type layer 6. Thereafter, the third shutter 19c is opened and the substrate 1 is introduced into the third reaction chamber 10c. Meanwhile, the third reaction chamber 10c has been charged with the same gas of the same pressure as in the second reaction chamber. When it is desired to form the n-type layer 7, the third reaction chamber 10c is charged with $PH_3$ gas, after the first shutter 19c is closed. The temperature of the substrate 1 in the reaction chamber 10c may be set at the same level as that in the first reaction chamber or that in the second reaction chamber, or may be different from the substrate temperatures in the first and second reaction chambers. It is generally known, however, a higher substrate temperature during the deposition of the n-type layer 7 provides smaller specific resistance of the formed n-type layer 7. After the formation of the n-type layer 7 by deposition, the fourth shutter 19d is opened and the substrate is introduced to an auxiliary chamber (not shown) which may be the same as that used for pre-heating the substrate 1 before the latter is introduced into the first reaction chamber 10a. When the same auxiliary chamber is used, the entrance of the production line serves also as an exit. When the production line is arranged linearly, the product can be taken out by reversing the conveyor through the third reaction chamber 10c, second reaction chamber 10b and the first reaction chamber 10a. Alternatively, the production line is arranged as a circle so that the substrate makes one revolution throughout the forming process.

For the purpose of moving the substrate from the third reaction chamber 10c into the auxiliary chamber after the formation of the n-type layer 7, the auxiliary chamber is charged with the gas of the same kind and pressure as those in the third reaction chamber 10c, e.g., the material gas containing $SiH_4$ and $PH_3$. Then, after the substrate has been moved, the fourth shutter 19d is closed. Since the material gas is stagnant in the auxiliary chamber, it is necessary to sufficiently purge this material gas before the product is taken out from the auxiliary chamber. If necessary, the rear surface electrode 4 may be formed on the substrate before the latter is taken out of the auxiliary chamber.

The supply of the impurity gases such as $B_2H_6$ and $PH_3$ is conducted with the assist of a carrier gas which may be $H_2$, Ar or He.

EMBODIMENT 2

Method of Producing TFT (Thin Film Transistor)

Figure 6:
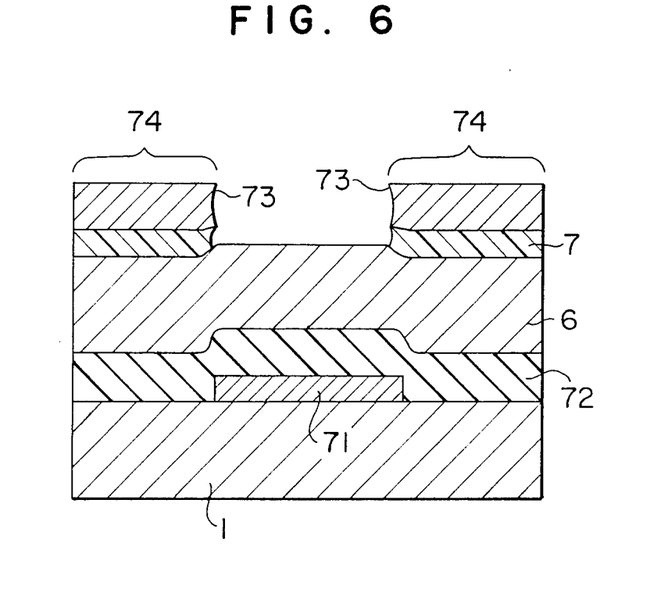
FIG. 6 is a vertical sectional view of an a-Si TFT (Thin Film Transistor) formed by an embodiment of the production method in accordance with the present invention.

This embodiment is used for the purpose of producing a TFT of the type shown in FIG. 6. The production of a TFT essentially requires formation of a gate insulating film 72 on the gate electrode 71. This can be accomplished by changing the material gas to be supplied to the first reaction chamber 10a. More specifically, referring to FIG. 6, a substrate 1 with the gate electrode 71 formed thereon is introduced into the apparatus shown in FIG. 1 and an $SiO_2$ layer as the gate insulating film 72 is formed in the first reaction chamber 10a, employing a material gas containing $SiH_4$ and a suitable oxidizing gas such as $O_2$ or $N_2O$. Other portions of the process are materially the same as those explained in connection with the Embodiment 1. After the i-type a-Si layer 6 and the n-type a-Si layer are formed, the n-type a-Si layer is selectively etched so as to leave source and drain regions 74 and then a metal film 73 constituting the source and drain wirings are formed by deposition.

A TFT having a construction inverted from that of the TFT shown in FIG. 6 requires that a material gas suitable for forming an n-type a-Si layer is introduced into the first reaction chamber 10a and that the third reaction chamber 10c is supplied with a material gas suitable for forming the gate insulating layer 72. In this case, however, it is essential that the n-type a-Si layer 7 is selectively removed before the substrate is introduced into the second reaction chamber 10b. According to the invention, it is thus possible to form a TFT at a high speed.

As will be understood from the foregoing description, the present invention offers the following advantages.

(1) The deposition rate can be adjusted independently for each layer in accordance with the thickness of the layer, such that the deposition rate is increased for forming a layer having a large thickness. This theoretically enables the production process to be conducted continuously. In addition, it is not necessary to stop the discharge in the second reaction chamber for forming the i-type layer. Although the discharge may be suspended in other reaction chambers, the period of suspension is very short.

(2) It is not necessary to purge the whole material gases in the successive reaction chambers during the transfer of the substrate from one to the other of such reaction chambers. This ensures an economical use of the material gases, and shortens dead time which hitherto has been necessary for the purging of the material gas.

(3) The conventional process requires, for example, 1 minute, 60 minutes and 3 minutes, respectively, the formation the p-type layer, i-type layer and the n-type layer. Thus, an impractically long time is wasted in the reaction chambers for forming the p-type layer and the n-type layer, because it is not allowed to move the substrates before the formation of the i-type layer is completed. According to the invention, however, the period can be shortened to, for example, 6 minutes, by employing a condition which enables the deposition rate in the reaction chamber for forming the i-type layer to be increased by 10 times.

(4) In general, in a processing line which employs a plurality of chambers, a higher operation efficiency is obtainable when the chambers has an equal size. The method of the invention makes it possible to equalize the sizes of all the chambers because the deposition rates in the respective reaction chambers are adjustable independently. This in turn enables the size of the whole apparatus to be reduced. In addition, the replacement of the parts of the chambers is facilitated and the cost of the apparatus can also be lowered thanks to the common use of the parts for all the chambers. For the same reasons, the maintenance of the apparatus is facilitated.

(5) Basically, the layers of different conductivity types are formed in different reaction chambers, thus eliminating unfavorable effects of residual impurities which may be caused when layers of different conductivity types are formed in the same reaction chamber. In addition, the reduced electrodes spacing contributes to a reduction of degassing through the wall of the reaction chamber, as well as to suppression of inclusion of impurities.

What is claimed is:

1. In a method of producing an amorphous silicon semiconductor device having the steps of:
preparing a capacitance-coupled high-frequency glow-discharge semiconductor production apparatus which is equipped with a plurality of glow-discharge chambers each having a high-frequency electrode and a substrate holder opposing each other and means for supplying material gases to said glow-discharge chambers;
effecting, in a first one of said glow-discharge chambers, plasma reaction so as to deposit, on a substrate introduced into the first glow-discharge chamber, a first amorphous silicon layer or a first amorphous layer consisting mainly of silicon having a first conductivity type, and
effecting, after moving said substrate into a second one of said glow-discharge chambers, a plasma reaction of a material gas different from said material gas used in the first glow-discharge chamber, thereby forming a second amorphous silicon layer of a second conductivity type on said first layer;
the improvement comprising:
that said substrate with said first amorphous silicon layer or said first amorphous layer mainly consisting of silicon of said first conductivity formed thereon is moved from said first glow-discharge chamber to said second glow-discharge chamber after a predetermined gas atmosphere is formed in said first glow-discharge chamber;
that the distance between said electrode and said substrate holder is made smaller in that one of said first and second glow-discharge chambers which is designed for forming the thicker one of said first and second layers than in the other of said first and second glow-discharge chambers;
that the temperature of said substrate is set higher in that one of said first and second glow-discharge chambers which is designed for forming the thicker one of said first and second layers; and
that the pressure is set higher in that one of said first and second glow-discharge chambers which is designed for forming the thicker one of said first and second layers than in the other of said first and second glow-discharge chambers.

2. A method of producing an amorphous silicon semiconductor device according to claim 1, wherein said material gas used in said first glow-discharge chamber contains a gas which delivers an impurity for determining the conductivity type of said first amorphous silicon layer or for varying the optical band gap of said first amorphous silicon layer, whle said material gas used in said second glow-discharge chamber does not contain any gas which delivers such an impurity.

3. In a method of producing an amorphous silicon semiconductor device having the steps of:
preparing a capacitance-coupled high-frequency glow-discharge semiconductor production apparatus which is equipped with a plurality of glow-discharge chambers each having a high-frequency electrode and a substrate holder opposing each other and means for supplying material gases to said glow-discharge chambers;
effecting, in a first one of said glow-discharge chambers, a plasma reaction of a material gas so as to deposit, on a substrate introduced into the first glow-discharge chamber, an amorphous silicon layer having a first conductivity type; and
effecting, after moving said substrate into a second one of said glow-discharge chambers, a plasma reaction of a material gas different from said material gas used in the first glow-discharge chamber, thereby forming an amorphous silicon layer or an amorphous layer consisting mainly of silicon having a second conductivity type on said layer of said first conductivity type;

the improvement comprising:

that said substrate with said amorphous silicon layer of said first conductivity formed thereon is moved from said first glow-discharge chamber to said second glow-discharge chamber after the gas atmosphere of the same kind and pressure as in said first glow-discharge chamber is established in said second glow-discharge chamber;

that the distance between said electrode and said substrate holder is made smaller in one of said first and second glow-discharge chambers which is designed for forming the thicker one of said layers of said first and second conductivity types than in the other of said first and second glow-discharge chambers; and that the temperature of said substrate is set higher in one of said first and second glow-discharge chambers which is designed for forming the thicker one of said layers of said first and second conductivity types than in the other of said first and second glow-discharge chambers.

4. A method of producing an amorphous silicon semiconductor device according to claim 3, wherein the material gas used in said first glow-discharge chamber does not contain any gas which would deliver an impurity, while the material gas used in said second glow-discharge chamber contains a gas for delivering an impurity for determining the conductivity type of said amorphous silicon layer or for varying the optical band gap of said amorphous silicon layer.

5. In a method of producing an amorphous silicon semiconductor device having the steps of:

preparing a capacitance-coupled high-frequency glow-discharge semiconductor production apparatus which is equipped with a plurality of glow-discharge chambers each having a high-frequency electrode and a substrate holder opposing each other and means for supplying material gases to said glow-discharge chambers;

effecting, in a first one of said glow-discharge chambers, a reaction of a material gas so as to form, on a substrate introduced into the first glow-discharge chamber, a semiconductor layer having a first conductivity type, and effecting, after moving said substrate into a second one of said glow-discharge chambers, a reaction of a material gas different from said material gas used in the first glow-discharge chamber, thereby forming a semiconductor layer having a second conductivity type on said semiconductor layer of said first conductivity type;

the improvement comprising:

that said substrate with said semiconductor layer of said first conductivity formed thereon is moved from said first glow-discharge chamber to said second glow-discharge chamber after a predetermined gas atmosphere is formed in said first glow-discharge chamber;

that the distance between said electrode and said substrate holder is made smaller in one of said first and second glow-discharge chambers which is designed for forming the thicker one of said semiconductor layers of said first and second conductivity types than in the other of said first and second glow-discharge chambers; and that the temperature of said substrate is set higher in one of said first and second glow-discharge chambers which is designed for forming the thicker one of said semiconductor layer of said first and second conductivity types than in the other of said first and second glow-discharge chambers.

* * * * *